(12) United States Patent
Kimura (10) Patent No.: US 6,420,738 B1
(45) Date of Patent: Jul. 16, 2002

(54) ELECTRIC CHARGE DETECTOR

(75) Inventor: Tetsuji Kimura, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/494,528

(22) Filed: Jan. 31, 2000

(30) Foreign Application Priority Data

Jan. 28, 1999 (JP) ............................................. 11-020642

(51) Int. Cl.[7] ....................... H01L 27/148; H01L 29/768
(52) U.S. Cl. .......................................... 257/223; 257/239
(58) Field of Search ................................. 257/223, 229, 257/230, 239

(56) References Cited

U.S. PATENT DOCUMENTS 5,572,051 A * 11/1996 Arakawa et al. ............ 257/225
5,615,242 A * 3/1997 Hirota ........................... 377/60
5,652,442 A * 7/1997 Roks ............................ 257/239

FOREIGN PATENT DOCUMENTS

JP          2828124           9/1998

* cited by examiner

Primary Examiner—Ngân V. Ngô
(74) Attorney, Agent, or Firm—Foley & Lardner (57) ABSTRACT

An electric charge detector includes an N-type semiconductor substrate 10 and a P-type well region 9 formed on the semiconductor substrate 10. An N-type well region 2 is formed on the P-type well region 9. A potential-change detection means is connected to the N-type well region 2 to detect a variation in surface potential of the N-type well region 2. The P-type diffused layer 11 is formed on a surface of the N-type well region 2.

11 Claims, 13 Drawing Sheets

SURFACE POTENTIAL

FIG. 14B

SURFACE POTENTIAL

ELECTRIC CHARGE DETECTOR

BACKGROUND OF THE INVENTION

The present invention relates to an electric charge detector suitable for a solid-state image device. Particularly, the present invention relates to an electric charge detector that can reduce distributed noises to improve the SNR (Signal-to-Noise Ratio).

Conventionally, the solid-state image devices such as CCD solid-state image devices utilizing the charge transfer function include electric charge detectors respectively. The common floating diode amplifier-type electric charge detector is disclosed in, for example, the reference "SOLID-STATE IMAGE DEVICES", authored by Yuji KIUCHI, supervised under Shin HASEGAWA, published by SHOKODO Publishing Co., and compiled by the Institute of Television Engineers of Japan (First Edition issued on Jul. 30, 1986), (see line 5, page 74 to line 5, page 75 and FIGS. 3.26(a) and 3.26(b)).

Figure 7:
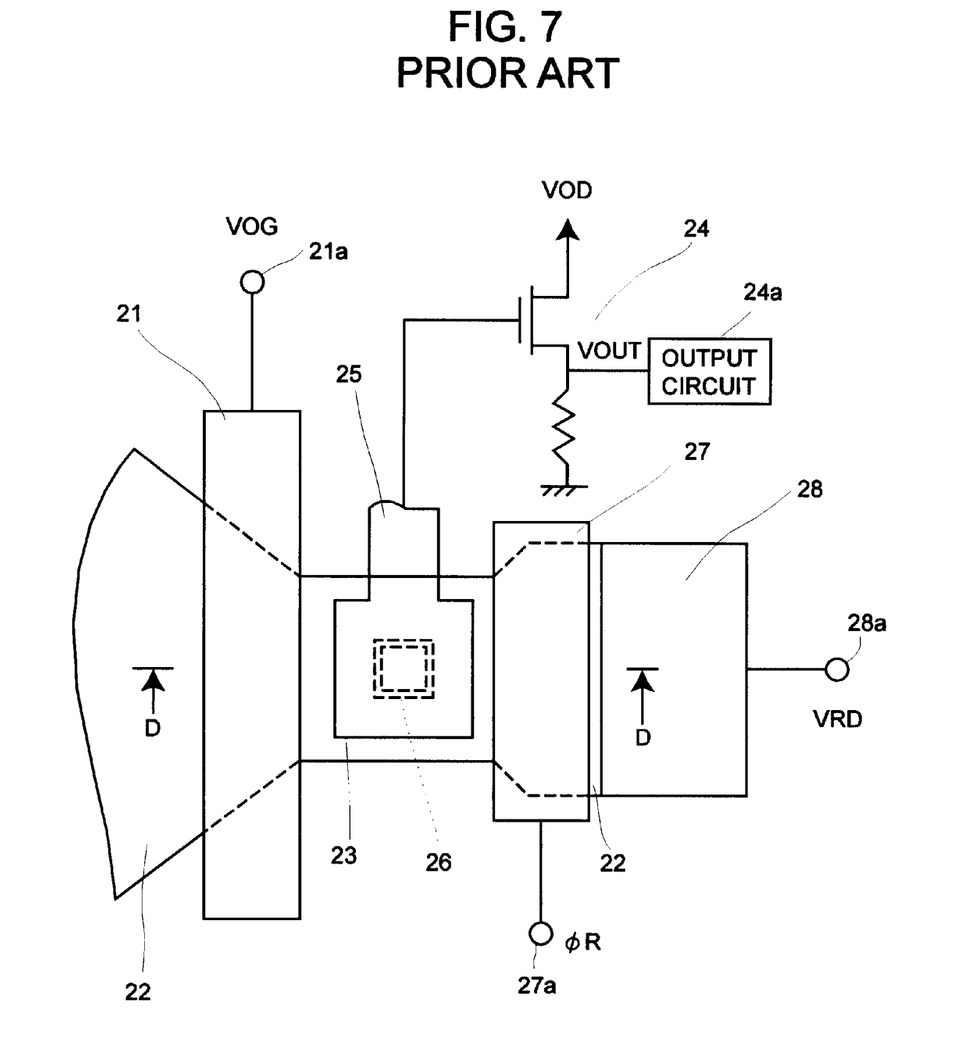
FIG. 7 is a plan view schematically illustrating the structure of a conventional electric charge detector.
Figure 8:
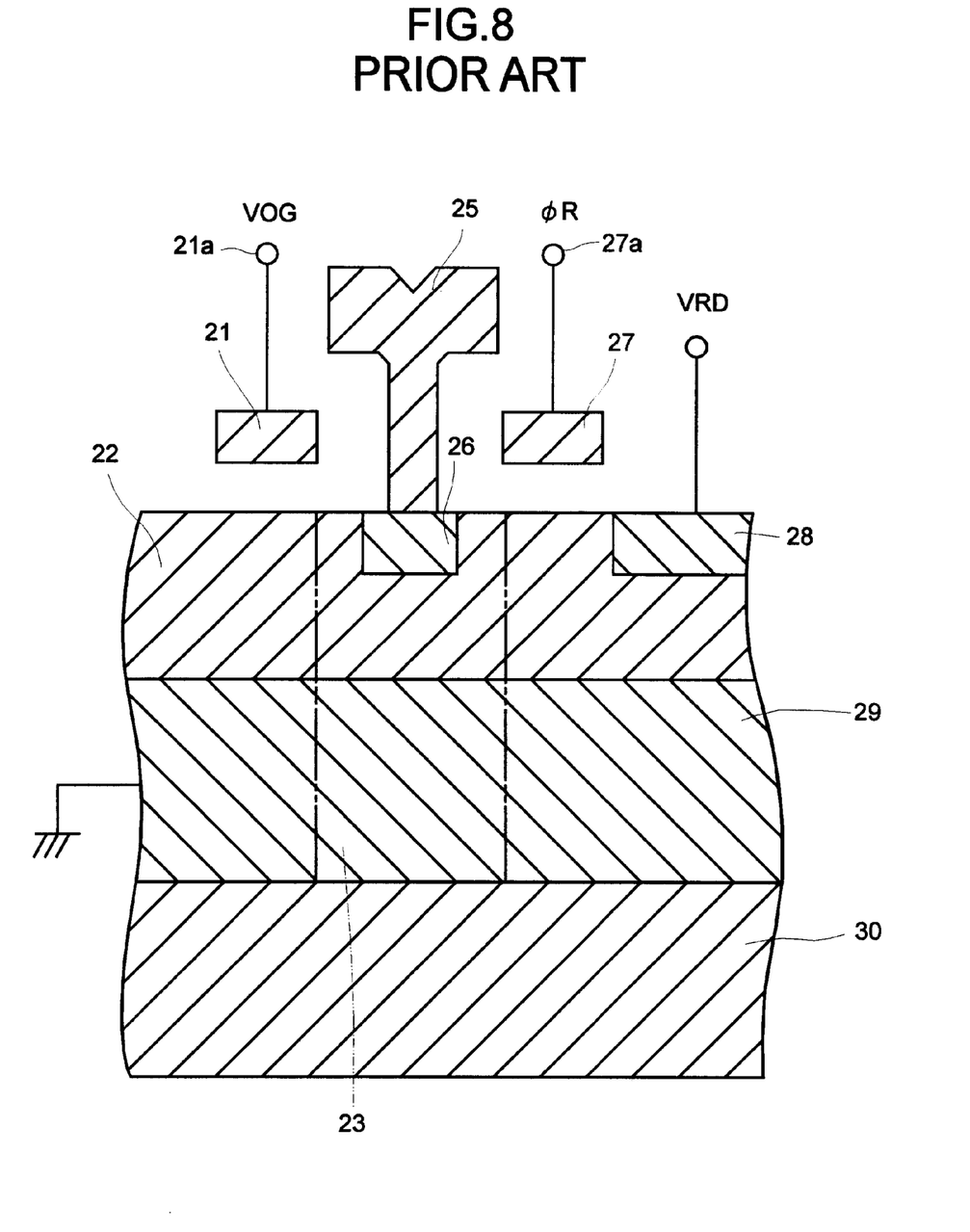
FIG. 8 is a cross sectional view schematically illustrating the conventional electric charge detector taken along the line D—D of FIG. 7.

FIG. 7 is a plan view schematically illustrating the configuration of a conventional electric charge detector. FIG. 8 is a cross sectional view illustrating the configuration of the conventional electric charge detector, taken along the line D—D of FIG. 7.

In the conventional electric charge detector, a P-type well region 29 is formed on the N-type semiconductor substrate 30. The P-type well region 29 is grounded. An N-type well region 22 is selectively formed on the P-well region 29. A LOCOS (local oxidation) structure (not shown), for instance, is formed around the N-type well region 22. Heavily-doped N-type diffused layers 26 and 28 are formed on the surface of the N-type well region 22.

A metal conductor (wire) 25 is in ohmic-contact with the heavily-doped N-type diffused layer 26. A source-follower amplifier 24 acting as an output amplifier is selectively connected to the metal conductor 25. An output circuit 24a is connected to the source follower amplifier 24 to receive the output signal VOUT.

An input gate electrode 21 is formed on the N-type well region 22 via the insulation film such as thermally-grown silicon dioxide film (not shown). The input gate electrode 21 controls the signal charge flown from an adjacent charge-coupled device (not shown). A gate terminal 21a is connected to the input gate electrode 21 to receive the gate electrode VOC.

A control terminal 28a is in connect with the surface of the heavily-doped N-type diffused layer 28 to reset potential VRD.

A gate electrode 27 is formed over the N-type well region 22 between the heavily-doped N-type diffused layers 26 and 28 via the insulation film (not shown) such as thermally-grown silicon dioxide. A gate terminal 27a is connected to the gate electrode 27 to receive the gate voltage φR.

In the conventional electric charge detector, a floating PN-junction diode 23 is formed of the P-type well region 29, the N-type well region 22, and the heavily-doped N-type diffused layer 26, which are disposed between the input gate electrode 21 and the input gate electrode 27. Moreover, a MOSFET-type reset transistor has the heavily-doped N-type diffused layer 26 acting as a source, the gate electrode 27 acting as a gate, and the heavily-doped N-type diffused layer 28 acting as a drain.

Figure 9:
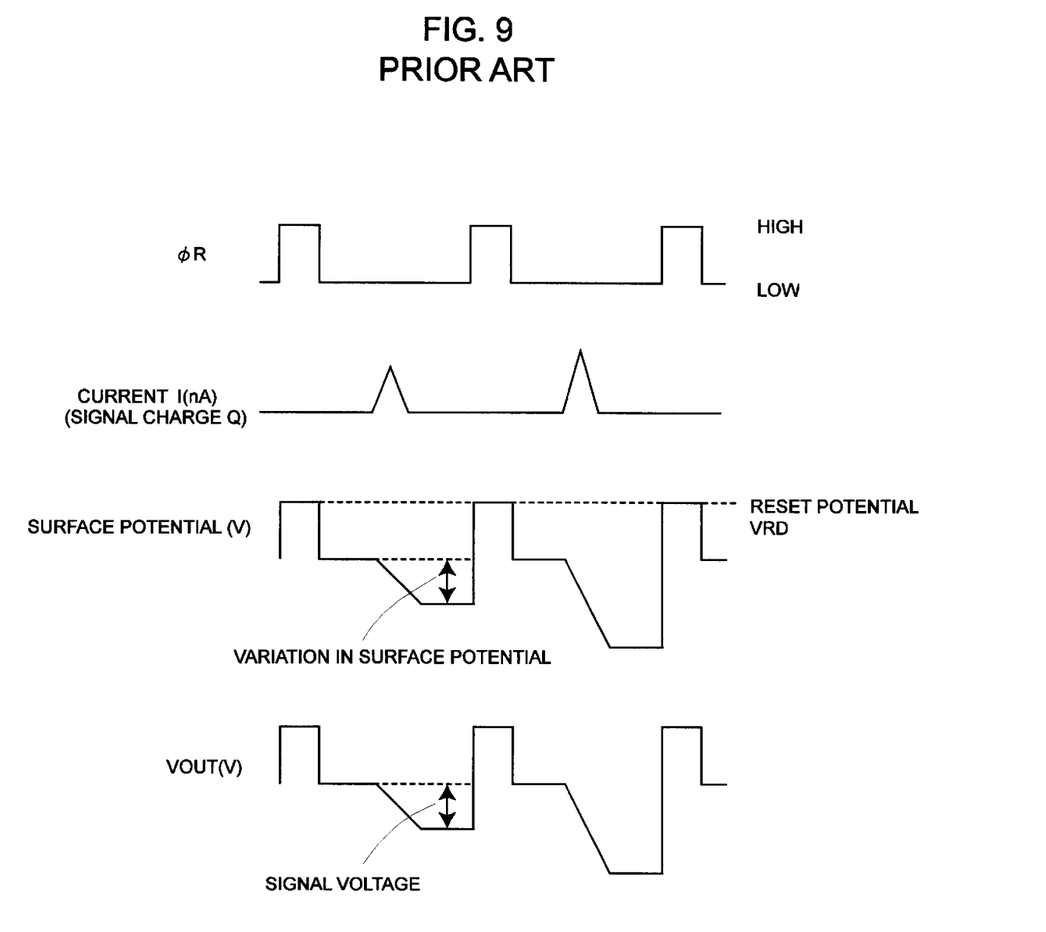
FIG. 9 is a timing chart illustrating the operation of the conventional electric charge detector.

FIG. 9 is a timing chart illustrating the operation of the conventional electric charge detector. In the conventional electric charge detector, when the gate electrode 27 is set to a high level, the MOSFET-type reset transistor will be turned on, so that unwanted signal charges accumulated in the floating diode 23 is drawn to the heavily-doped N-type diffused region 28 acting as the drain thereof. At the same time, the surface potential of the floating diode 23 is held to a fixed reset potential VRD of about 12 to 15 volts.

Thereafter, when the gate electrode 27 is set to a low level, the reset transistor is turned off. In the charge-coupled device, the signal charge Q (that is, the signal current I (nA)) passes underneath the input gate electrode 21 and then sinks into the potential well of the floating diode 23. The signal charge Q is expressed by the following formula (1).

$$Q = \int I dt \qquad (1)$$

The source follower amplifier 24 outputs as an output signal VOUT the resulting variation of the channel potential of the floating diode 23 via the metal conductor 25. That is, the signal charge Q (expressed by the formula (1)) is converted into a variation in the surface potential of the floating diode 23. The source follower amplifier 24 amplifies the variation via the metal conductor 25 and then outputs it as a signal voltage.

When the output signal VOUT is output, the electric charge accumulated in the floating diode 23 are unwanted. This boosts the gate electrode 27 to a high level to reset the reset transistor 24. As a result, the unwanted charges are drawn out. The electric charges transferred from the charge-coupled device are sequentially detected by repeating the series of the operation, so that a predetermined voltage is obtained.

However, in the conventional electric charge detector, thermal noises and distributed noises generate because of the switching operation of the reset transistor in the reset operation, thus deteriorating the S/N ratio.

Those noises do not depend on the signal charge amount accumulated in the floating diode. Hence, this problem becomes remarkable as the integration density of the solid-state image device increases, that is, with shrinkage of the unit pixel size and reduction of a signal charge amount per pixel.

It is known that the thermal noise is proportional to the absolute temperature or the junction capacity of the floating diode. The floating diode is designed to reduce its size as small as possible, within an allowable range of the normal design rule.

The principle on the generation of distributed noises is disclosed in, for instance, "Partition Noise in CCD Signal Detection", written by N. Teranishi and N. Mutoh, IEEE Trans, Electron devices, Vol. ED-33, pp. 1696–1701(1986).

Figure 10:
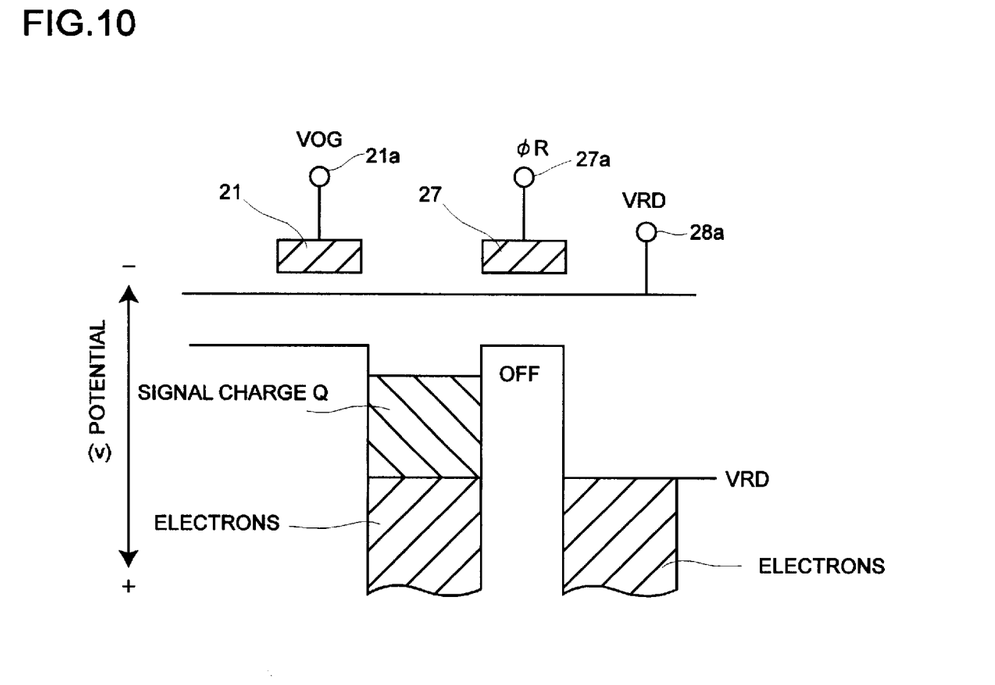
FIG. 10 is a schematic diagram illustrating the principle of generation of distributed noises, following the steps.
Figure 11:
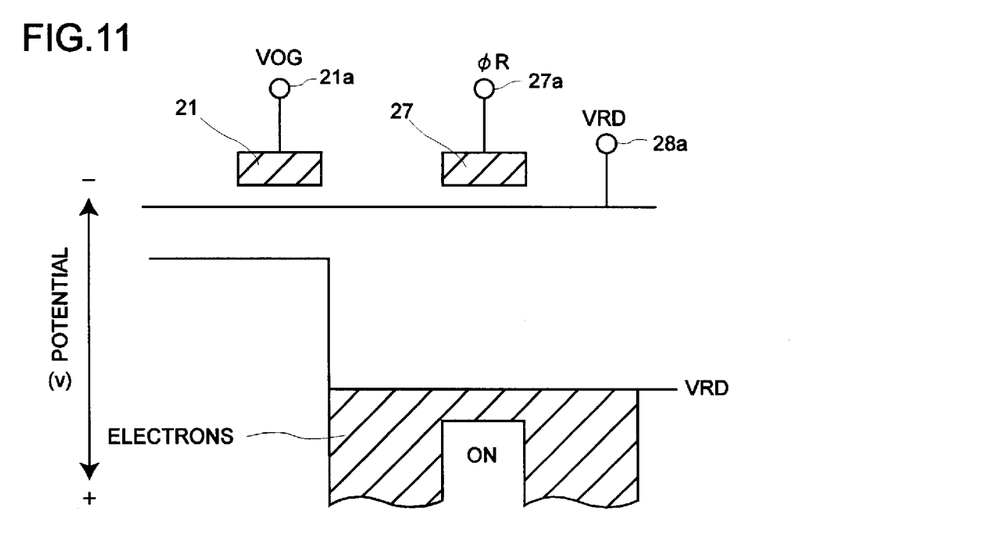
FIG. 11 is a schematic diagram illustrating the principle of generation of distributed noises, according to the post-steps following the steps of FIG. 10.
Figure 12:
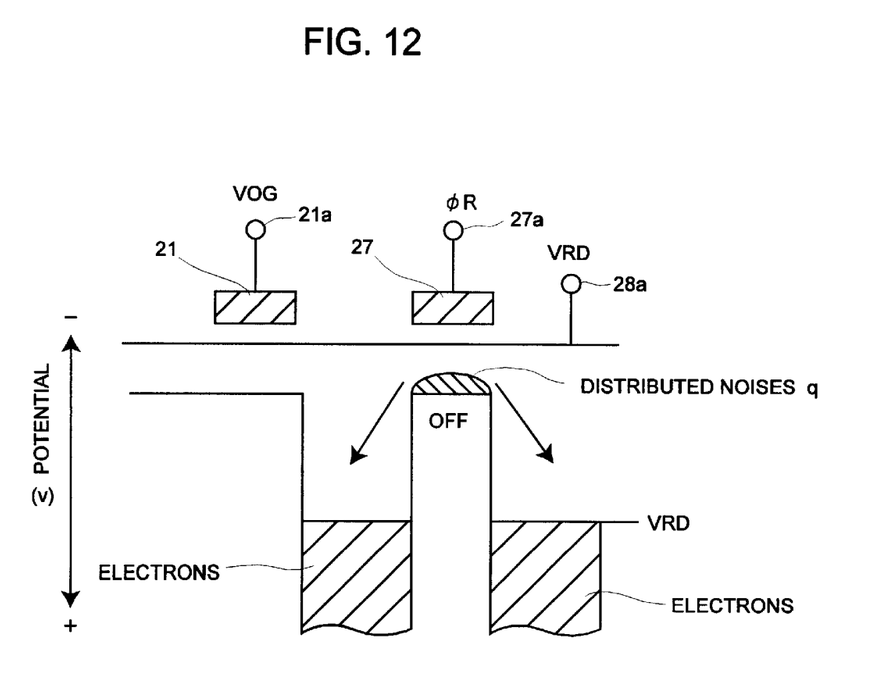
FIG. 12 is a schematic diagram illustrating the principle of generation of distributed noises, according to the post-steps following the steps of FIG. 11.

Each of FIGS. 10 to 12 is a schematic diagram illustrating the principle on generation of distributed noises according to steps. As shown in FIG. 10, the floating diode 23 accumulates electric charges. When the reset transistor is in an off state, the signal charges Q and electrons exist in the potential well of the floating diode 23.

Thereafter, as shown in FIG. 11, when the potential of the gate electrode 27 is in a high level and when the reset transistor is in an on state, the signal charge Q is drawn out of the potential well through the heavily-doped N-type diffused layer 28 acting as the drain of the reset transistor. In this case, electrons exist underneath the gate electrode 27 because the potential VRD of the reset channel underneath the gate electrode 27 is lower than that of the heavily-doped N-type diffused layer 28.

With the potential of the gate electrode 27 in a low level and with the reset transistor in an off state, as shown in FIG. 12, part of electrons existing in the reset channel are distributed to the floating diode. This causes the distributed noise. It is known that the charge amount q of the distributed noise is proportional to the reset channel capacity and the absolute temperature.

In consideration of variations in the channel potential of the reset transistor due to the device fabrication, the channel potential underneath the gate electrode 27 of the reset transistor is normally about 0.5 volts higher than the reset drain potential VRD at the on state.

The capacitance C1 of the reset channel is normally about ¼ to ⅕ of that of the floating diode C0. Hence, the following formula (2) is applicable to the voltage conversion value Np of the distributed noise.

$$C0 \times Np = C1 \times 0.5 \times K$$

$$C1 = (1/4)C0 \sim (1/5)C0 \tag{2}$$

where K is a ratio of electrons underneath the reset channel to be distributed to the floating diode 23 and is $0 \leq K \leq 1$.

Therefore, the voltage conversion value Np of the distributed noise is expressed by the following formula:

$$Np = K \times (0.1 \sim 0.125)(V) \tag{3}$$

In the normal situation where the potential of the reset channel is at a fixed value and there is no potential gradient between the reset drain and the floating diode, the distributed noise is split in half to the floating diode side and the reset drain side, that is, K is ½. Hence, the voltage conversion value Np of a distributed noise is expressed by the formula (4).

$$Np = 0.05 \sim 0.0625(V) \tag{4}$$

The voltage conversion value Np is added as a dummy signal to the signal voltage.

Figure 13:
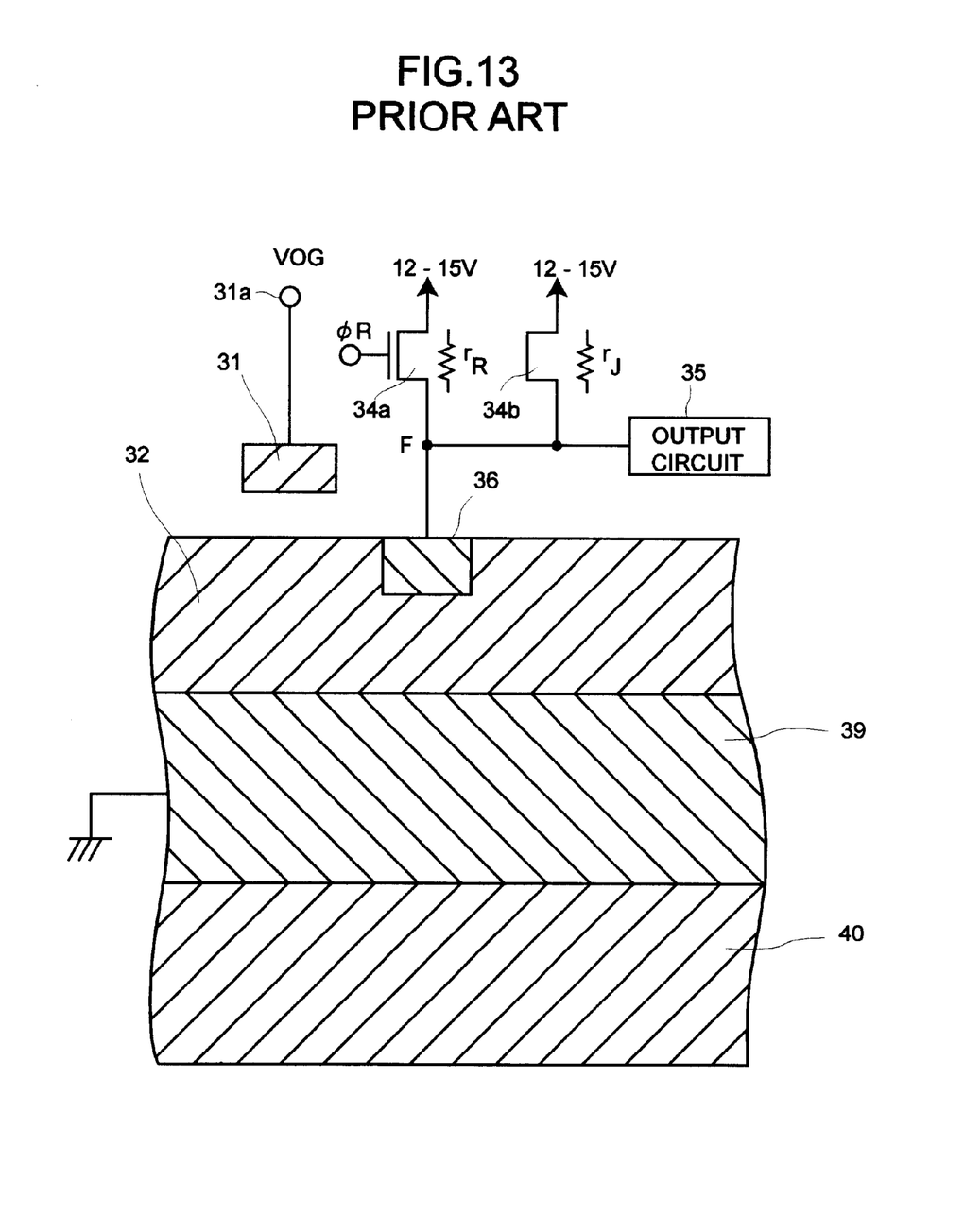
FIG. 13 is a cross sectional view schematically illustrating the conventional electric charge detector disclosed in Patent Publication No. 2828124.

Japanese Patent Publication No. 2828124 discloses the electric charge detector designed to reduce distributed noises. FIG. 13 is a cross sectional view schematically illustrating the conventional electric charge detector disclosed in Japanese Patent publication No. 2828124.

In the conventional electric charge detector, a P-type well region 39 is formed on the N-type semiconductor substrate 40. An N-type well region 32 is selectively formed on the P-type well region 39. A P-type diffused layer 36 is selectively formed on the surface of the N-type well region 32.

A reset transistor 34a, a load junction field-effect transistor (JFET) 34b, and an output circuit 35 are connected to the surface of the P-type well region 36.

An input gate electrode 31 is formed on the N-type well region 32 via the thermally-grown silicon oxide film (not shown) to control signal charges incoming from an adjacent charge coupled device (not shown). A gate electrode 31a is connected to the input gate electrode 31 to apply the gate voltage VOG. This conventional electric charge detector can suppress the electron distribution.

The above-mentioned electric charge detector can achieve the previously aimed results. However, the potential at the charge detection point F depends on the balance between the resistance $r_R$ of the reset transistor 34a, the on resistance $r_j$ of the load JFET 34b and the power source voltage (12 to 15 volts). Hence, this detector has the disadvantage in that the potential normally becomes a very low voltage, e.g. 9 to 10 volts, compared with the power source voltage.

Figure 14A:
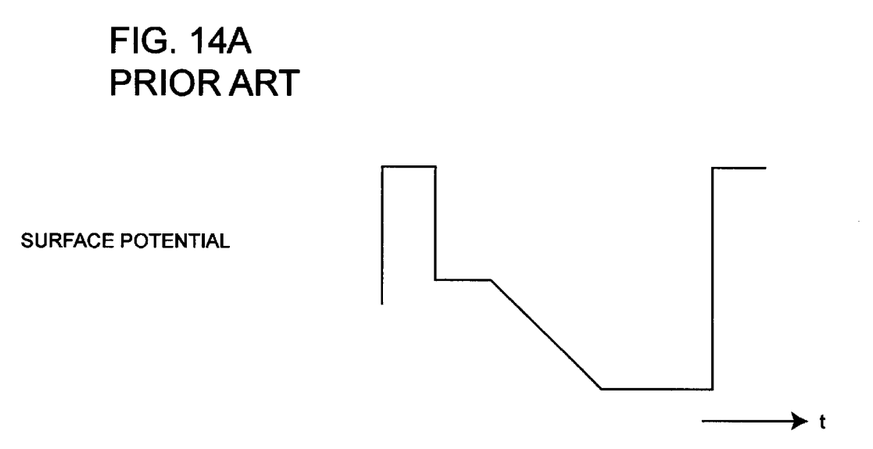
FIG. 14A is a timing chart illustrating the output signal of the conventional electric charge detector.
Figure 14B:
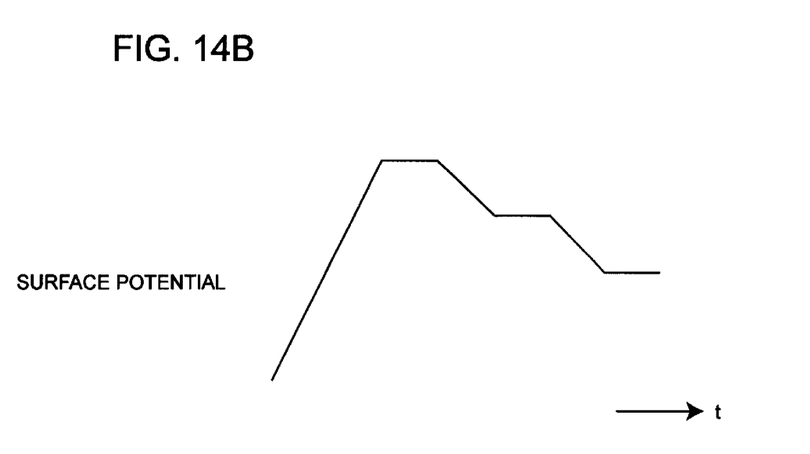
FIG. 14B is a timing chart illustrating the output signal of the electric charge detector when the potential of the point F is equal to the power source potential.

With $r_R \ll r_j$, the potential at the point F is equal to the power source voltage. In this case, the drain potential of the load JFET 34b acting as a constant current source is substantially equal to the source potential thereof. For that reason, the load JFET 34b cannot sufficiently operate as a constant current source. FIG. 14A is a timing chart illustrating the output signal of the conventional electric charge detector. FIG. 14B is a timing chart illustrating the output signal of the conventional electric charge detector, with the potential at the point F equalized with the power source potential. When the potential at the point F is equal to the power source voltage, the waveform at the falling edge of the output signal is sloped, as shown in FIG. 14, thus decreasing the operational speed. The potential at the point F must be determined in design, by considering the characteristics of the load JFET 34b and the reset transistor 34a. However, such a design is very difficult because of variations in characteristic during the device fabrication.

SUMMARY OF THE INVENTION

The present invention is made to solve the above-mentioned problems.

Moreover, the objective of the invention is to provide an electric charge detector that can be easily designed and can prevent generation of distributed noises.

The objective of the present invention is achieved by a an electric charge detector comprising a semiconductor substrate; a first conductivity-type well region formed on the semiconductor substrate; a second conductivity-type well region formed on the first conductivity-type well region; potential-change detection means connected to the second conductivity-type well region, for detecting a change in a surface potential of the second conductivity-type well region; and a first conductivity-type diffused region formed on the surface of the second conductivity-type well region.

According to the present invention, when a floating diode formed of the second conductivity-type well region and the first conductivity-type diffused layer is forwardly biased, unwanted electric charges accumulated therein are ejected. The structure of the present invention requires no conventional MOS transistors, thus preventing the distributed noise of 0.05 to 0.0625 volts generated in the conventional device.

A floating diode may be formed of the first conductivity-type well region and the second conductivity-type well region.

Moreover, a forward bias potential can be applied to the diode formed of the first conductivity-type well region and the second conductivity-type well region to eject unwanted electric charges accumulated in the floating diode. The first conductivity-type well region may be grounded.

Moreover, according to the present invention, the electric charge detector further comprises an insulating film formed on the second conductivity-type well region; and gate electrodes formed on the insulating film, each for controlling electric charges entering from a charge-coupled device to the floating diode.

Moreover, according to the present invention, the electric charge detector further comprises a second conductivity-type diffused layer, acting as a connection region, formed in a surface of the second conductivity-type well region, the second conductivity-type diffused layer having an impurity concentration higher than that of the second conductivity-type well region, the connection region being connected to the potential-change detection region.

BRIEF DESCRIPTION OF THE INVENTION

This and other objects, features, and advantages of the present invention will become more apparent upon a reading of the following detailed description and drawings, in which.

DESCRIPTION OF THE EMBODIMENTS

Figure 1:
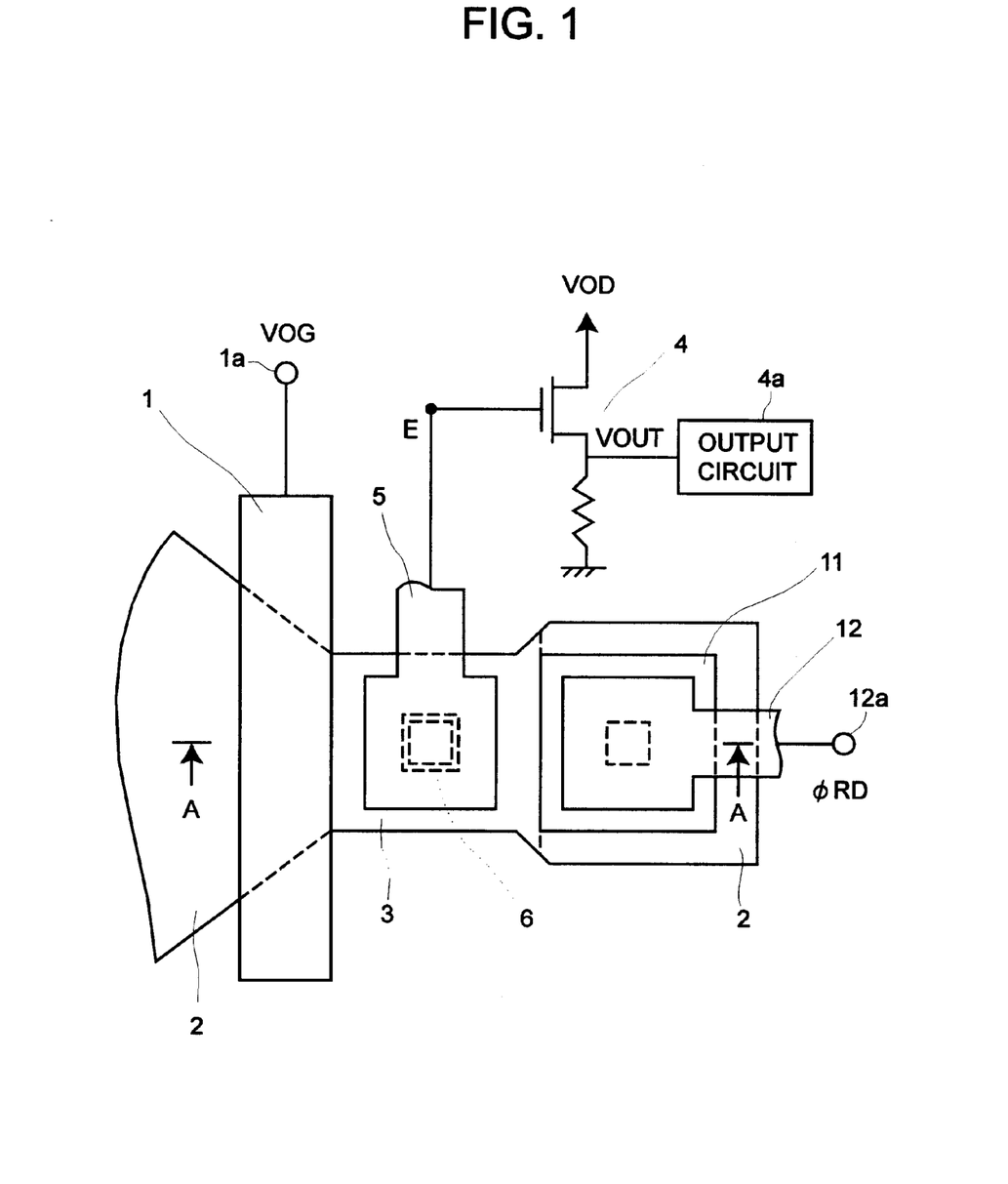
FIG. 1 is a plan view schematically illustrating an electric charge detector according to an embodiment of the present invention.
Figure 2:
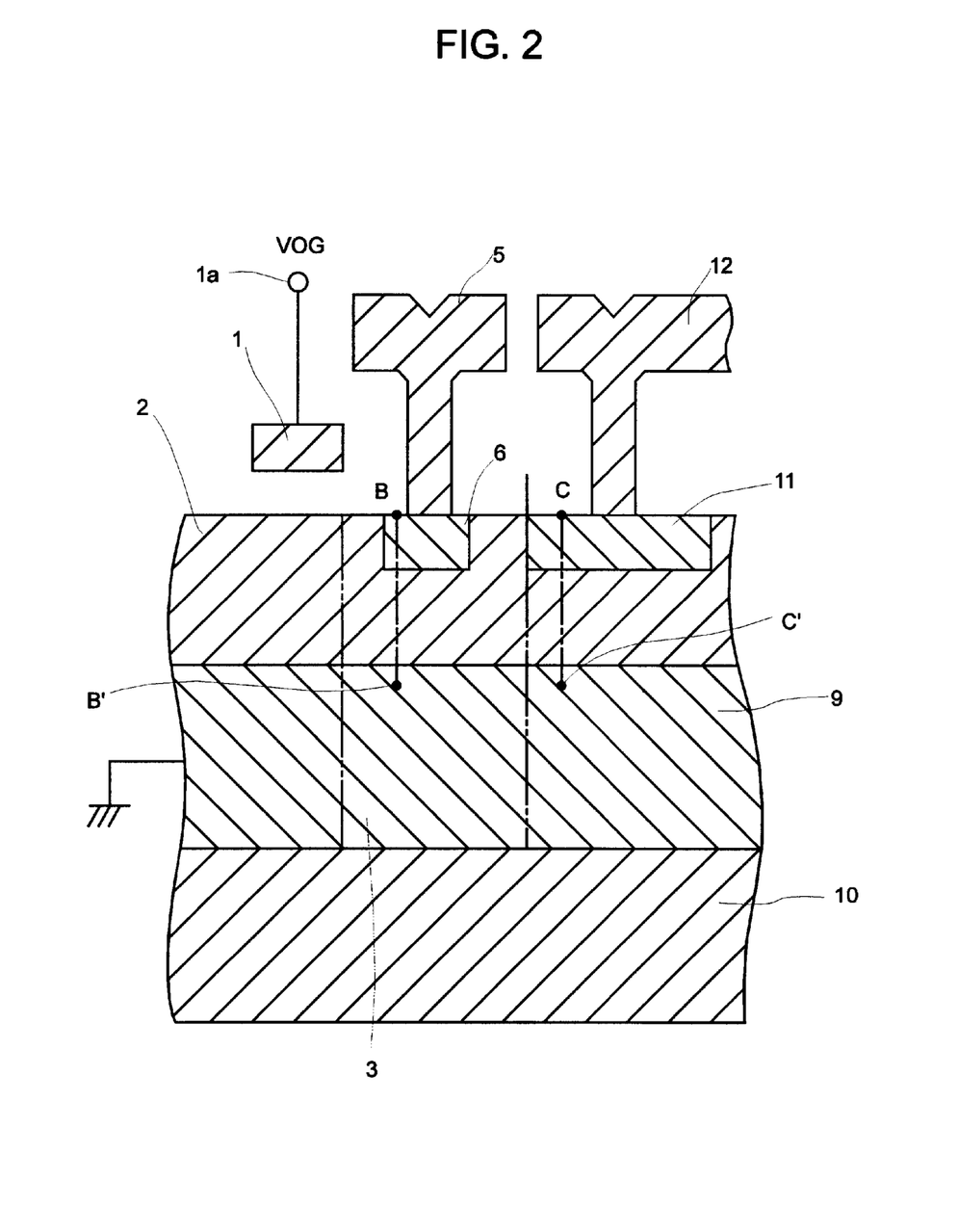
FIG. 2 is a cross sectional view schematically illustrating the structure of an electric charge detector taken along the line A—A of FIG. 1.

The electric charge detector according to embodiments of the present invention will be described below in detail with reference to the attached drawings. FIG. 1 is a plan view schematically illustrating the configuration of an electric charge detector according to the first embodiment of the present invention. FIG. 2 is a cross sectional view schematically illustrating the configuration of an electric charge detector according to the first embodiment of the present invention, taken along the line A—A of FIG. 1.

A P-type well region 9 is formed on an N-type semiconductor substrate 10. The P-type well region 9 is formed by ion-implanting P-type impurities, e.g. boron, at a concentration of $10^{12}$ (atoms/cm$^2$) into the surface of the N-type substrate 10 and then thermally diffusing them at 1200 to 1300° C. for 10 to 20 hours. The P-well region 9 is grounded. An N-type well region 2 is selectively formed on the P-well region 9. The N-type well region 2 is formed by ion-implanting N-type impurities, e.g. phosphorus or arsenic, at a concentration of $10^{12}$ to $10^{13}$ (atoms/cm$^2$) into the surface of the P-type well region 9 and then thermally diffusing them at 1100 to 1200° C. for 1 to 2 hours. A LOCOS structure (not shown) is formed around the N-type well region 2. A heavily-doped N-type diffused region 6 and a P-type diffused region 11 are selectively formed on the surface of the N-type well region 2. The P-type diffused layer 11 is formed by ion-implanting P-type impurities, e.g. boron, at a concentration of $10^{12}$ to $10_{13}$ (atoms/cm$^2$) into the surface of the N-type well region 2.

A first metal conductor 5 is in ohmic contact with the surface of the heavily-doped N-type diffused layer 6. A source follower amplifier 4 acting as an output amplifier is connected to the first metal conductor 5. An output circuit 4a is connected to the source follower amplifier 4 to receive the output signal VOUT.

An input gate electrode 1 is formed on the N-type well region 2 via an insulation film (not shown) of thermally-grown silicon dioxide to control signal electric charges from the adjacent charge-coupled device (not shown). A gate terminal 1a is connected to the input gate electrode 1 to receive the gate voltage VOG.

A second metal conductor 12 is in ohmic contact with the surface of the P-type diffused layer 11. A control terminal 12a is connected to the second metal conductor 12 to receive clock pulse signals φRD.

In this embodiment, a floating diode 3 is formed of the P-type well region 9, the N-type well region 2, and the heavily-doped N-type diffused layer 6 surrounded by the input gate electrode 1 and the P-type diffused layer 11. A PN junction diode is formed of the N-well region 2 and the P-well diffused layer 11.

Figure 3A:
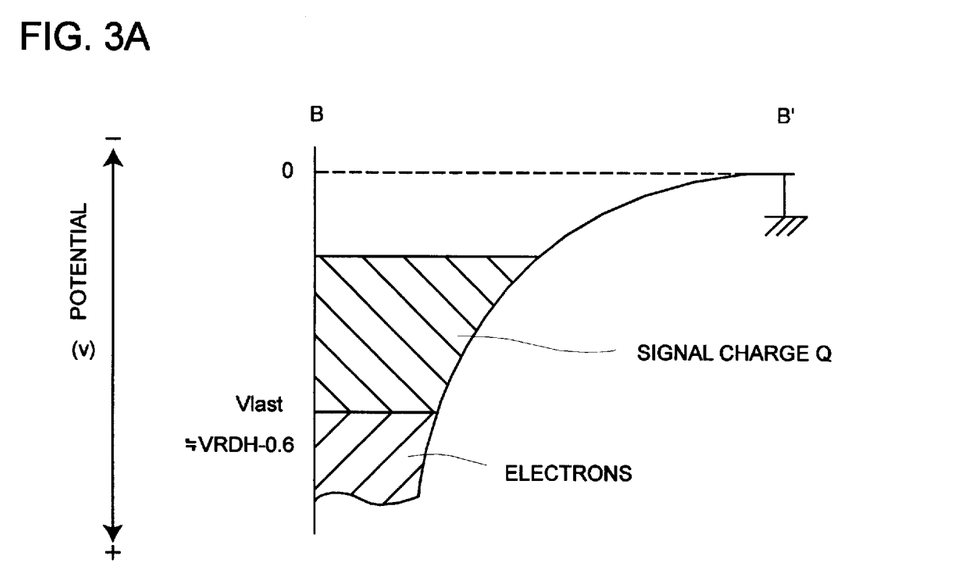
FIG. 3A is a schematic diagram illustrating the first operation of the electric charge detector according to the embodiment of the present invention.
Figure 3B:
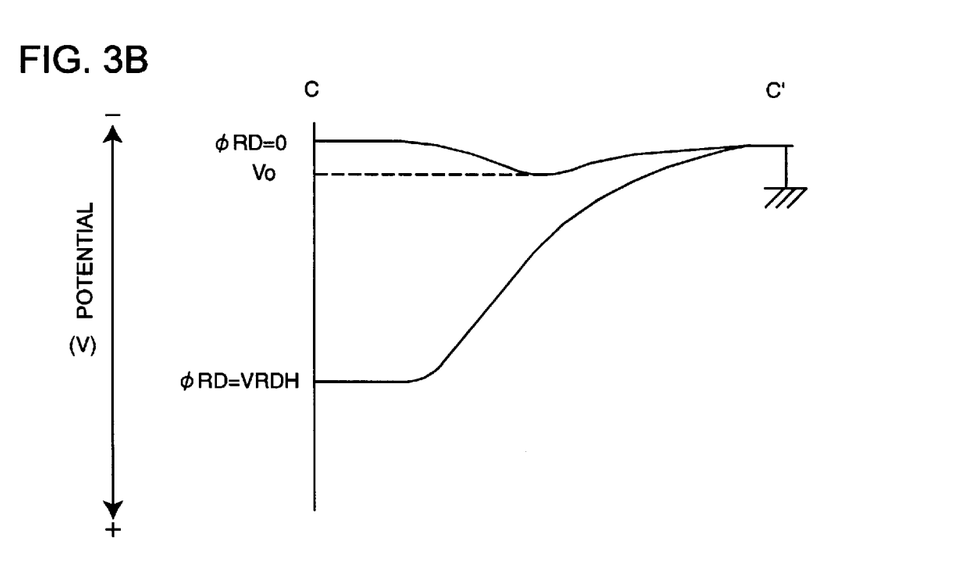
FIG. 3B is a schematic diagram illustrating the first operation of the electric charge detector according to the embodiment of the present invention.
Figure 4:
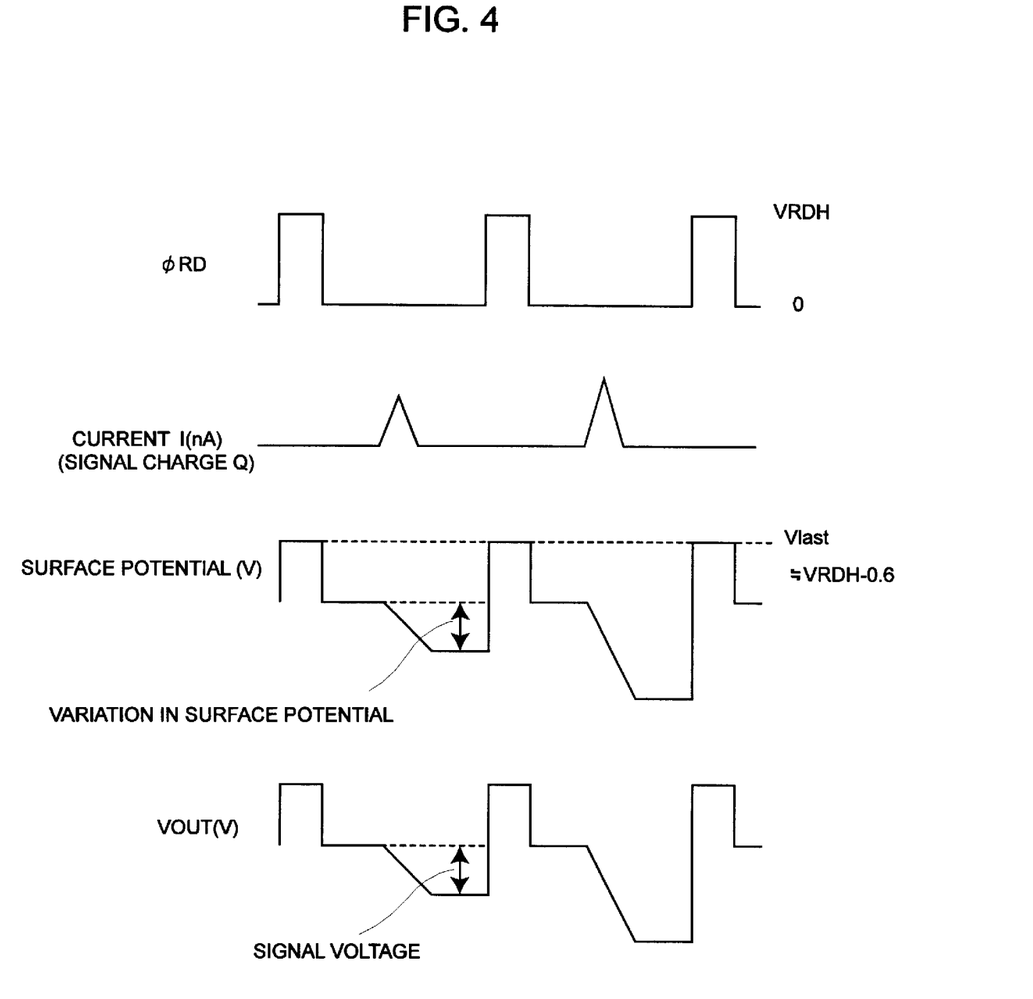
FIG. 4 is a timing chart illustrating the first operation of the electric charge detector according to the invention of the present invention.

Next, the first operation of this embodiment will be described here. FIGS. 3A and 3B illustrate the first operation of the electric charge detector according to the embodiment of the present invention. FIG. 3A is a schematic diagram illustrating the potential distribution between the lines B–B' in FIG. 2. FIG. 3B is a schematic diagram illustrating the potential distribution between the lines C–C' in FIG. 2. FIG. 4 is a timing chart illustrating the first operation of the electric charge detector according to the embodiment of the present invention.

In the present embodiment, since the clock pulse signal φRD=0 (V) and the potential of the P-type diffused layer 11 is zero (V), as shown in FIG. 3B, the potential of the P-well region 9 is always zero (V). Hence, the channel potential V0 in the direction C–C' of the N-type well region 2 is about 1 volt. The channel potential V0 of about 1 volt is sufficiently low, compared with the channel potential in the direction B–B' shown in FIG. 3A. The clock pulse signal φRD (=0 (V)) is externally applied to the P-type diffused layer 11 via the second metal conductor 12. During the period of 0 (V), the floating diode 3 accumulates the signal charges so that the signal charge Q expressed by the formula (1) is converted into a variation of the surface potential of the floating diode 3. The source follower amplifier 4 amplifiers the variation input via the first metal conductor 5 and then outputs it as a signal voltage. Thus, the electric charge detector can detect the signal charge.

When the signal charge Q is detected, the input gate electrode 1 is controlled during the zero-volt period to flow the signal charge Q from the charge-coupled device (not shown) to the floating diode 3 through the N-type well region 2 underneath the input gate electrode 1. Then, upon the accumulation, the source follower amplifier 4 outputs the variation of the channel potential of the floating diode 3.

Thereafter, in order to eject the unwanted signal charges Q after the end of the signal charge detection, a clock pulse signal (φRD) of a potential VRDH of about 12 to 15 volts is applied to the P-type diffused layer 11 via the second metal conductor 12, the PN junction diode formed of the P-type diffused layer 11 and the N-type well region 2 is forwardly biased. In this state, according to the forward bias characteristic of the PN-junction diode, the signal charge Q is fast ejected via the second metal conductor 12 to the potential Vlast of (VRDH−0.6 volts).

Then, the potential of the P-type diffused layer 11 is restored to 0 (V) (φRD=0 (V)) so that the reset operation is completed.

As described above, this embodiment does not have the conventional reset channel formed by a MOS reset transistor. The distribution noise, caused by some of electrons existing in the reset transistor distributed to the floating diode 3, does not occur even in the reset operation using the PN-junction diode.

Since the P-type diffused layer 11 for resetting and the heavily-doped N-type diffused layer 6 for charge detection are differently fabricated, the reset potential at the point E is about (VRDH−0.6 V) and has less variations. The voltage of 0.6 (V) may vary ±0.05 V or less. However, it is considered that the variation is substantially negligible.

Figure 5A:
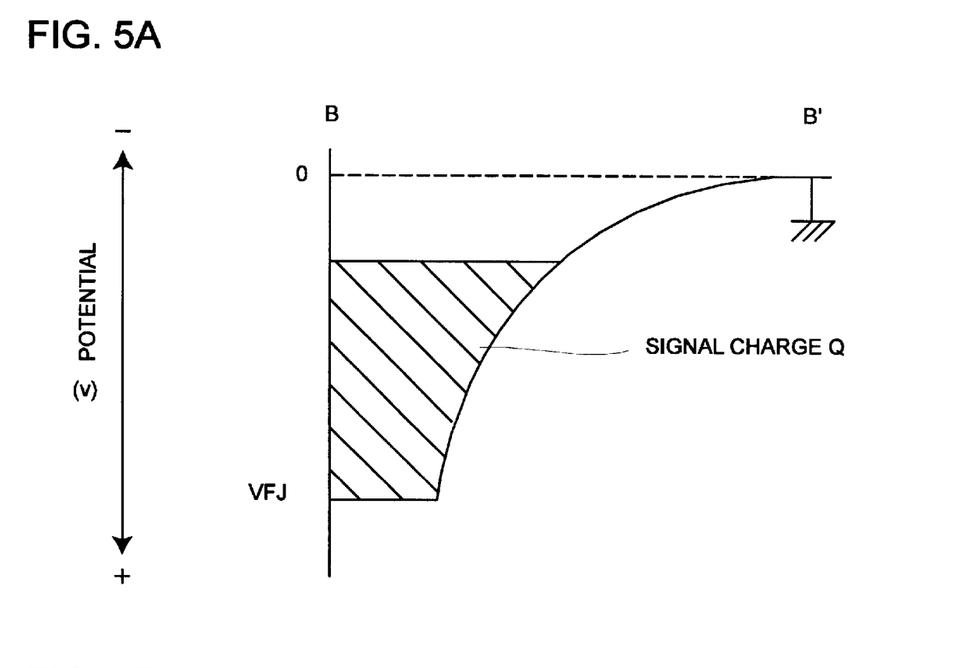
FIG. 5A is a schematic diagram illustrating the second operation of the electric charge detector according to the embodiment of the present invention.
Figure 5B:
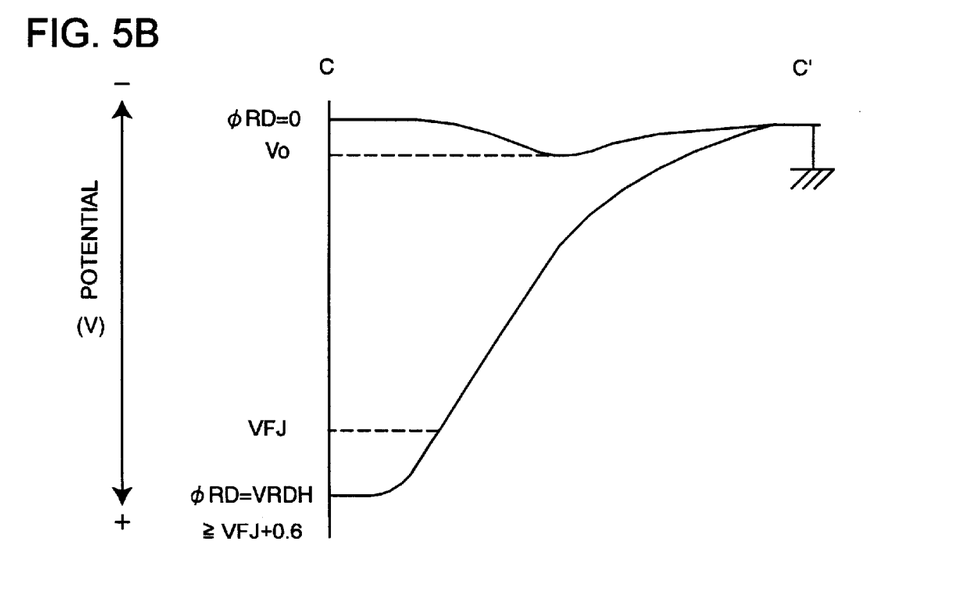
FIG. 5B is a schematic diagram illustrating the second operation of the electric charge detector according to the embodiment of the present invention.
Figure 6:
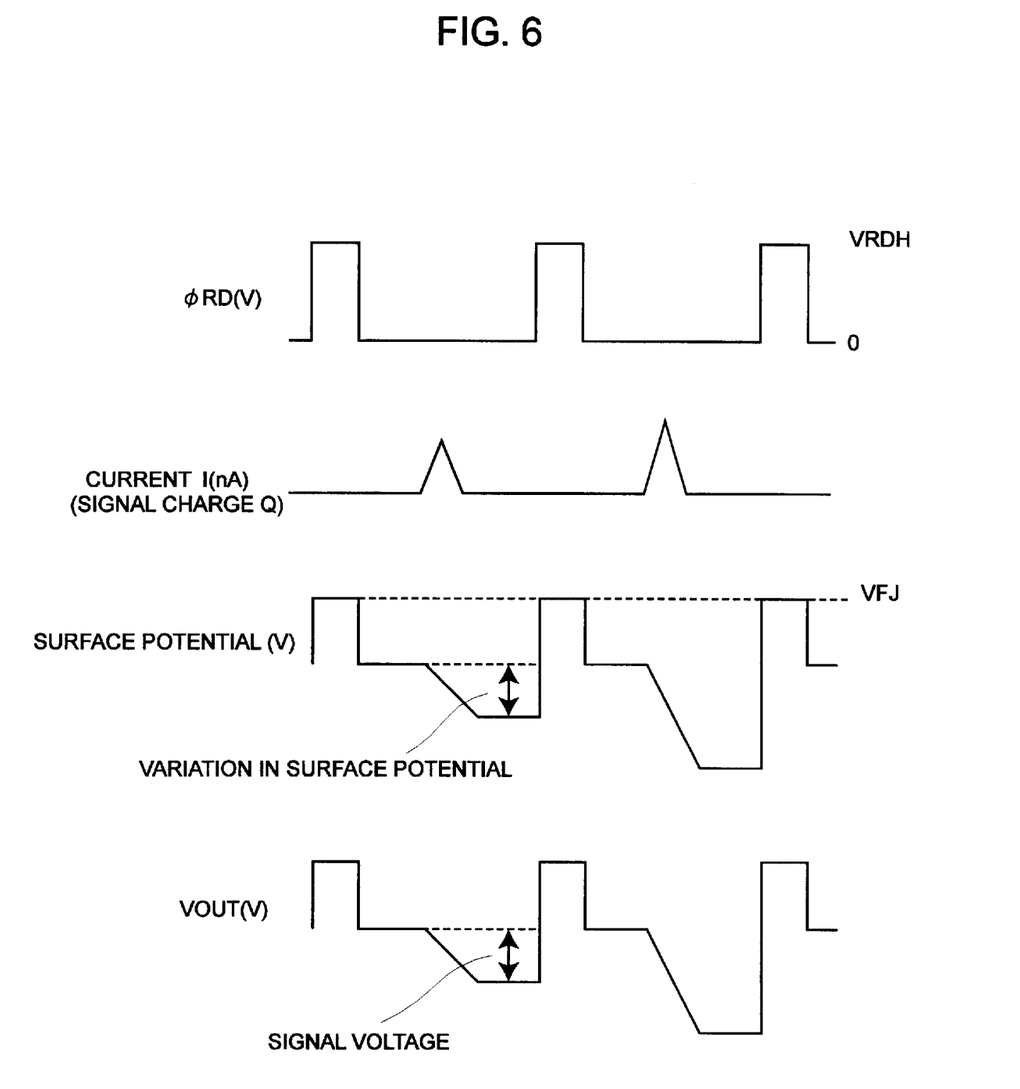
FIG. 6 is a timing chart illustrating the second operation of the electric charge detector according to the invention of the present invention.

Next, the second operation of the electric charge detector in the above embodiment will be described here. FIG. 5A and 5B illustrate the second operation of the electric charge detector in the embodiment of the present invention. FIG. 5A is a schematic diagram illustrating the potential distribution between the lines B–B' in FIG. 2. FIG. 5B is a schematic diagram illustrating the potential distribution between the lines C–C' in FIG. 2. FIG. 6 is a timing chart illustrating the second operation of the electric charge detector in the embodiment of the present invention.

In the second operation, the high level VRDH of the pulse RD applied to the P-type diffused layer 11 via the second metal conductor 12 in the reset operation is 0.6 (V) higher than the potential of the depletion potential VFJ of the floating diode 3. The second operation differs from the first operation in the setting operation. The depletion potential VFJ is a potential for clearing minority carriers existing in the floating diode 3.

When the signal charge Q is detected, the input gate electrode 1 is controlled, with the clock pulse signal φ RD being 0(V) and with the potential of the P-type diffused layer 11 being 0(V). Thus, the signal charge Q passes from the charge-coupled device (not shown) to the floating diode 3 via the N-type well region 2 underneath the input gate electrode 11. Concurrently with the accumulation, the source follower amplifier 4 outputs a change of the channel potential of the floating diode 3.

Thereafter, in order to remove the unwanted signal charge Q after the completion of the signal charge detection, a clock pulse signal (φRD) of the potential VRDH (≧(20 to 25 volts+0.6 volts) larger than (VFJ (20 to 25 volts)+0.6 volts) is applied to the P-type diffused layer 11 via the second metal conductor 12. As a result, the PN-junction diode between the P-type diffused layer 11 and the N-type well region 2 is forwardly biased.

Next, the potential of the P-type diffused layer 11 is restored to 0 volts (φRD=0 (V)) so that the reset operation is completed.

The depletion potential VFJ of the floating diode 3 is set to a high voltage of about 20 to 25 volts because of the heavily-doped N-type diffused layer 6 forming an ohmic contact between the floating diode 3 and the first metal conductor 5. Hence, in the second operation, the reset pulse signal φRD must be set to the high voltage VRDH of (20 to 25 volts+0.6 volts), compared with the first operation, but all the signal charges Q existing in the floating diode 3 can be ousted from the PN junction. This feature allows thermal noises due to the thermal fluctuation of signal charges existing in the floating diode 3 to be nulled in the second operation.

As described above, according to the present invention, the unnecessary electric charges accumulated in the floating diode can be ejected by forwardly biasing the diode formed of the second conductivity-type well region and the first conductivity-type diffused layer. For that reason, the present invention can eliminate the conventional MOS transistor and can prevent an occurrence of the distributed noises of about 0.05 to 0.0625 volts. In most cases, the thermal noise and distributed noise generated in the rest operation have nearly the same value, respectively. Hence, the configuration of the present invention can remove a half of noise components, thus doubling the SN ratio.

The entire disclosure of Japanese Application No. 11-20642 filed Jan. 28, 1999 including specification, claims, drawing and summary are incorporated herein by reference in its entirely.

What is claimed is:

1. An electric charge detector, comprising:
   a semiconductor substrate;
   a first conductivity-type well region formed on said semiconductor substrate;
   a second conductivity-type well region formed on said first conductivity-type well region;
   potential-change detection means connected to said second conductivity-type well region, for detecting a change in a surface potential of said second conductivity-type well region;
   a first conductivity-type diffused region formed on the surface of said second conductivity-type well region; and
   a second conductivity-type diffused layer, acting as a connection region, formed in a surface of said second conductivity-type well region, said second conductivity-type diffused layer having an impunty concentration higher than that of said second conductivity-type well region, said connection region being connected to said potential-change detection region.

2. The electric charge detector defined in claim 1, wherein said first conductivity-type well region is grounded.

3. The electric charge detector defined in claim 1, further comprising a floating diode formed of said first conductivity-type well region and said second conductivity-type well region.

4. The electric charge detector defined in claim 3, further comprising:
   an insulating film formed on said second conductivity-type well region; and
   gate electrodes formed on said insulating film, each for controlling electric charges entering from a charge-coupled device to said floating diode.

5. The electric charge detector defined in claim 3, wherein said first conductivity-type well region is grounded.

6. The electric charge detector defined in claim 3, wherein a forward bias potential is applied to said floating diode formed of said first conductivity-type well region and said second conductivity-type well region to eject unwanted electric charges accumulated in said floating diode.

7. The electric charge detector defined in claim 6, wherein said first conductivity-type well region is grounded.

8. The electric charge detector defined in claim 6, further comprising:

an insulating film formed on said second conductivity-type well region; and gate electrodes formed on said insulating film, each for controlling electric charges entering from a charge-coupled device to said floating diode.

9. The electric charge detector defined in claim 6, further comprising a second conductivity-type diffused layer, acting as a connection region, formed in a surface of said second conductivity-type well region, said second conductivity-type diffused layer having an impurity concentration higher than that of said second conductivity-type well region, said connection region being connected to said potential-change detection region.

10. An electric charge detector, comprising:

a semiconductor substrate;

a first conductivity-type well region formed on said semiconductor substrate;

a second conductivity-type well region formed on said first conductivity-type well region;

potential-change detection means connected to said second conductivity-type well region, for detecting a change in a surface potential of said second conductivity-type well region;

a first conductivity-type diffused region formed on the surface of said second conductivity-type well region; and a second conductivity-type diffused layer, acting as a connection region, formed in a surface of said second conductivity-type well region, said second conductivity-type diffused layer having an impurity concentration higher than that of said second conductivity-type well region, said connection region being connected to said potential-change detection region;

whereby a floating diode is formed of said first conductivity-type well region and said second conductivity-type well region; and whereby a diode is formed of said first conductivity-type well region and said second conductivity-type well region; said diode being forward biased to eject unwanted electric charges accumulated in said floating diode.

11. An electric charge detector, comprising:

a semiconductor substrate;

a first conductivity-type well region formed on said semiconductor substrate;

a second conductivity-type well region formed on said first conductivity-type well region;

potential-change detection means connected to said second conductivity-type well region, for detecting a change in a surface potential of said second conductivity-type well region;

a first conductivity-type diffused region formed on the surface of said second conductivity-type well region; and a second conductivity-type diffused layer, acting as a connection region, formed in a surface of said second conductivity-type well region, said second conductivity-type diffused layer having an impurity concentration higher than that of said second conductivity-type well region, said connection region being connected to said potential-change detection region;

an insulating film formed on said second conductivity-type well region; and gate electrodes formed on said insulating film, each for controlling electric charges entering from a charge-coupled device to a floating diode whereby said floating diode is formed of said first conductivity-type well region and said second conductivity-type well region; and whereby a diode is formed of said first conductivity-type well region and said second conductivity-type well region; said diode being forward biased to eject unwanted electric charges accumulated in said floating diode.

* * * * *